(12) United States Patent
Arcus et al.

(10) Patent No.: US 7,834,672 B2
(45) Date of Patent: Nov. 16, 2010

(54) LOW POWER CHARGE PUMP

(75) Inventors: Christopher G. Arcus, San Jose, CA (US); Vincent Tso, Milpitas, CA (US); James Ho, San Jose, CA (US)

(73) Assignee: Exar Corporation, Fremont, CA (US)

( * ) Notice: Subject to any disclaimer, the term of this patent is extended or adjusted under 35 U.S.C. 154(b) by 29 days.

(21) Appl. No.: 11/673,569

(22) Filed: Feb. 10, 2007

(65) Prior Publication Data

US 2007/0189429 A1     Aug. 16, 2007

Related U.S. Application Data

(60) Provisional application No. 60/772,482, filed on Feb. 10, 2006.

(51) Int. Cl.
*H03L 7/06* (2006.01)
(52) U.S. Cl. ...................................................... 327/157
(58) Field of Classification Search .................. 327/3, 327/7, 9, 12, 148, 157, 536, 537; 375/374, 375/375
See application file for complete search history.

(56) References Cited

U.S. PATENT DOCUMENTS

| | | | |
|---|---|---|---|
| 6,124,741 A | 9/2000 | Arcus | |
| 6,256,362 B1* | 7/2001 | Goldman | 375/373 |
| 2002/0140469 A1* | 10/2002 | Lever | 327/157 |
| 2005/0083090 A1* | 4/2005 | Moraveji | 327/157 |

* cited by examiner

*Primary Examiner*—Lincoln Donovan
*Assistant Examiner*—Colleen O'Toole
(74) *Attorney, Agent, or Firm*—Townsend and Townsend and Crew LLP (57) ABSTRACT

A charge pump is configured to control current flow at an output node in response to input signals. A plurality of control signals are generated based upon the input signals. The control signals operate to control the timing and duration of current flows within the charge pump and to thereby reduce charge pump power consumption. Based upon the control signals, the conductivity of a first path between a power supply and the output node and a second path between the output node and a ground potential is varied. Optionally, the charge pump is disposed as part of a phase-locked loop (PLL), the input signals are produced by a phase/frequency detector, and current flow at the output node controls an oscillator element.

13 Claims, 7 Drawing Sheets

LOW POWER CHARGE PUMP

CROSS-REFERENCES TO RELATED APPLICATIONS

This application claims benefit under 35 USC 119(e) of U.S. Provisional Application No. 60/772,482 filed on Feb. 10, 2006, entitled "Low Power Charge Pump," the content of which is incorporated herein by reference in its entirety.

BACKGROUND OF THE INVENTION

The present invention relates to electronic circuits, and more particularly to phase-locked loops and charge pumps adapted for use therewith.

Phase-locked loops (PLLs) are widely used to generate clock signals. Using feedback, the PLL generates one or more output signals having a phase and frequency that closely tracks a reference signal while maintaining stability and satisfying performance requirements.

Some or all of the components of a modern PLL may be embodied in an integrated circuit. Integrated circuits containing PLLs are used in a broad range of applications. In many of these applications, low power consumption and fast response times are important design considerations.

Figure 2:
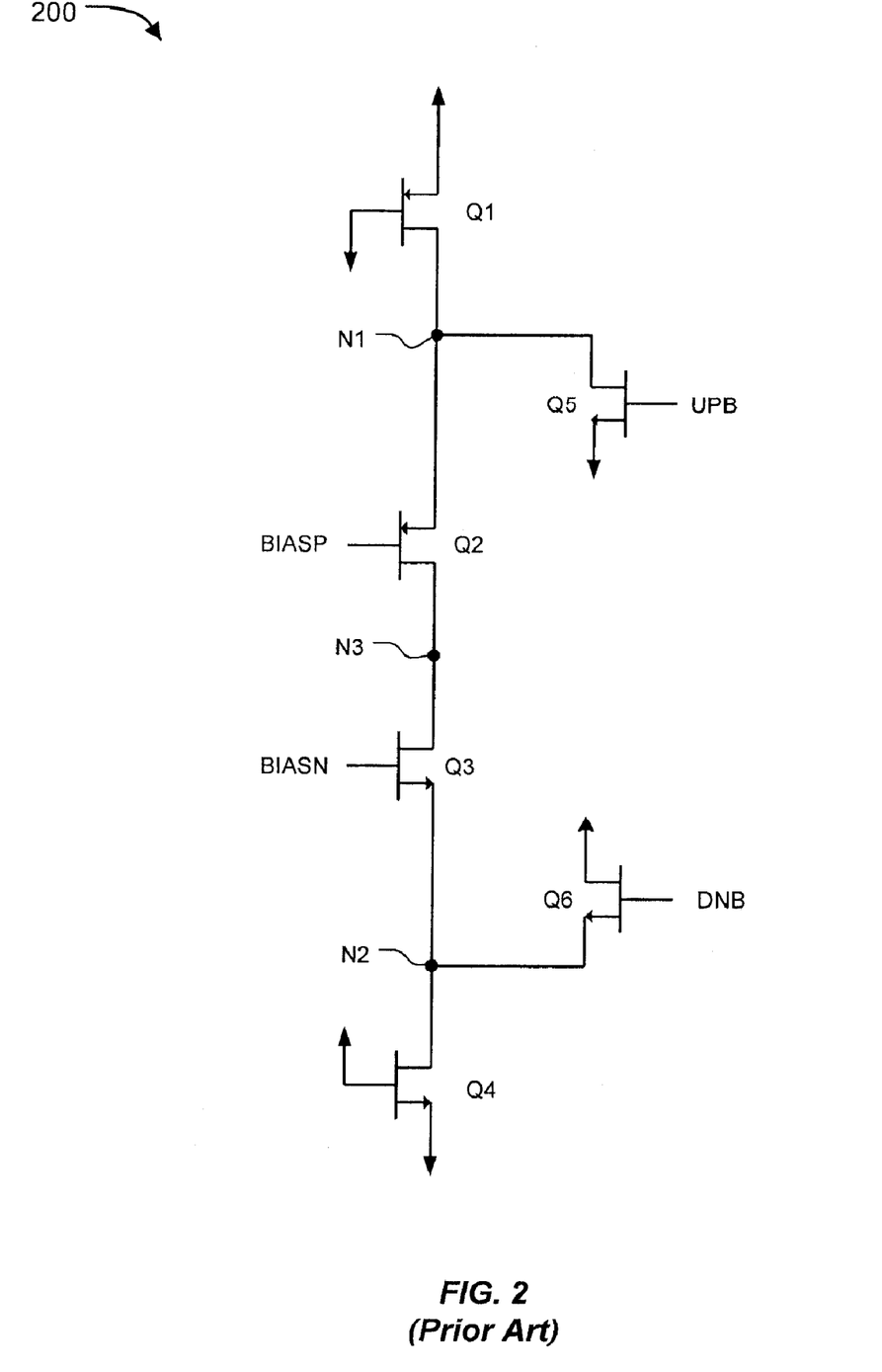
FIG. 2 is a simplified schematic diagram of a charge pump as known in the prior art.

FIG. 2 shows a charge pump 200 as known in the prior art. In operation, a constant current flows in charge pump 200 as the PLL approaches and achieves lock. As shown, transistor Q5 responds to signal UPB by causing a current to flow into node N1 and transistor Q6 responds to signal DNB by causing a current to flow into node N2. These currents significantly increase charge pump power consumption. There is thus a need in the art for low-power PLLs and related components.

BRIEF SUMMARY OF THE INVENTION

In accordance with the present invention, a circuit is operative to control current flow at an output node. The circuit includes, in part, a first path configured to supply current to the output node and a second path configured to receive current from the output node. The first path of the circuit includes a first switch, a second switch, and a first current source. The first switch is responsive to a first control signal and is coupled to the first current source at a first node. The first current source is responsive to a second control signal. The second switch is coupled to the first node and to an output node of the circuit. The second path includes a third switch, a fourth switch, and a second current source. The third switch is responsive to a third control signal and is coupled to the second current source at a second node. The second current source is responsive to a fourth control signal. The fourth switch is coupled between the second node and the output node.

In some embodiments, the circuit includes a first delay line configured to receive a first input signal and to produce the second control signal by delaying the first input signal for a first predetermined amount of time and a second delay line configured to receive the second control signal and to produce a fifth signal by delaying the second control signal for a second predetermined amount of time. The circuit may additionally include a third delay line configured to receive a second input signal and to produce the fourth control signal by delaying the second input signal for the first predetermined amount of time and a fourth delay line configured to receive the fourth control signal and to produce a sixth signal by delaying the fourth control signal for the second predetermined amount of time.

In some embodiments, the circuit also includes a first latch having a set terminal adapted to receive the fifth signal and a reset terminal adapted to receive the first input signal. The first latch is configured to generate the first control signal at its output. The circuit also includes a second latch having a set terminal adapted to receive the second input signal and a reset terminal adapted to receive the sixth signal. The second latch is configured to generate the third control signal at its output.

In some embodiments, the circuit includes a capacitor coupled to the output node wherein a voltage of the capacitor is increased when current flows in the first path and the voltage of the capacitor is decreased when current flows in the second path. The circuit may also include a phase/frequency detector configured to generate the first and second input signals and a voltage-controlled oscillator coupled with the output node operative to generate an output signal that varies according to a voltage of the output node.

In accordance with another embodiment of the present invention, a method of controlling a charge pump is disclosed. The method includes supplying current to an output node of the charge pump via a first conduction path in response to a first control signal. The first conduction path has a first control node. The method also includes sinking current from the output node via a second conduction path having a second control node in response to a second control signal. The method provides reducing a conductivity of the first conduction path in response to a third control signal by lowering a voltage of the first control node and also reducing a conductivity of the second conduction path in response to a fourth control signal by raising a voltage of the second control node. According to the method, the voltage of the first control node is lowered by adding a first bias current to the first control node based upon the first and third control signals, and the voltage of the second control node is raised by adding a second bias current to the second control node based upon the second and fourth control signals.

In some embodiments, the method includes generating the first control signal such that the first control signal is de-asserted before and after an edge of the second control signal and generating the third control signal such that the third control signal is asserted before and after an edge of the fourth control signal. The method may further include generating the second control signal by delaying a first input signal for predetermined amount of time and generating the fourth control signal by delaying a second input signal for predetermined amount of time. The first conduction path may be interrupted if the voltage of the first node drops below a first threshold value and the second conduction path may be interrupted if the voltage of the second node exceeds a second threshold value.

DETAILED DESCRIPTION OF THE INVENTION

A charge pump is configured to control current flow at an output node in response to input signals. A plurality of control signals are generated based upon the input signals. The control signals operate to control the timing and duration of current flows within the charge pump and to thereby reduce charge pump power consumption. Based upon the control signals, the conductivity of a first path between a power supply and the output node and a second path between the output node and a ground potential is varied. Optionally, the charge pump is disposed as part of a phase-locked loop (PLL), the input signals are produced by a phase/frequency detector, and current flow at the output node controls an oscillator element.

Figure 1:
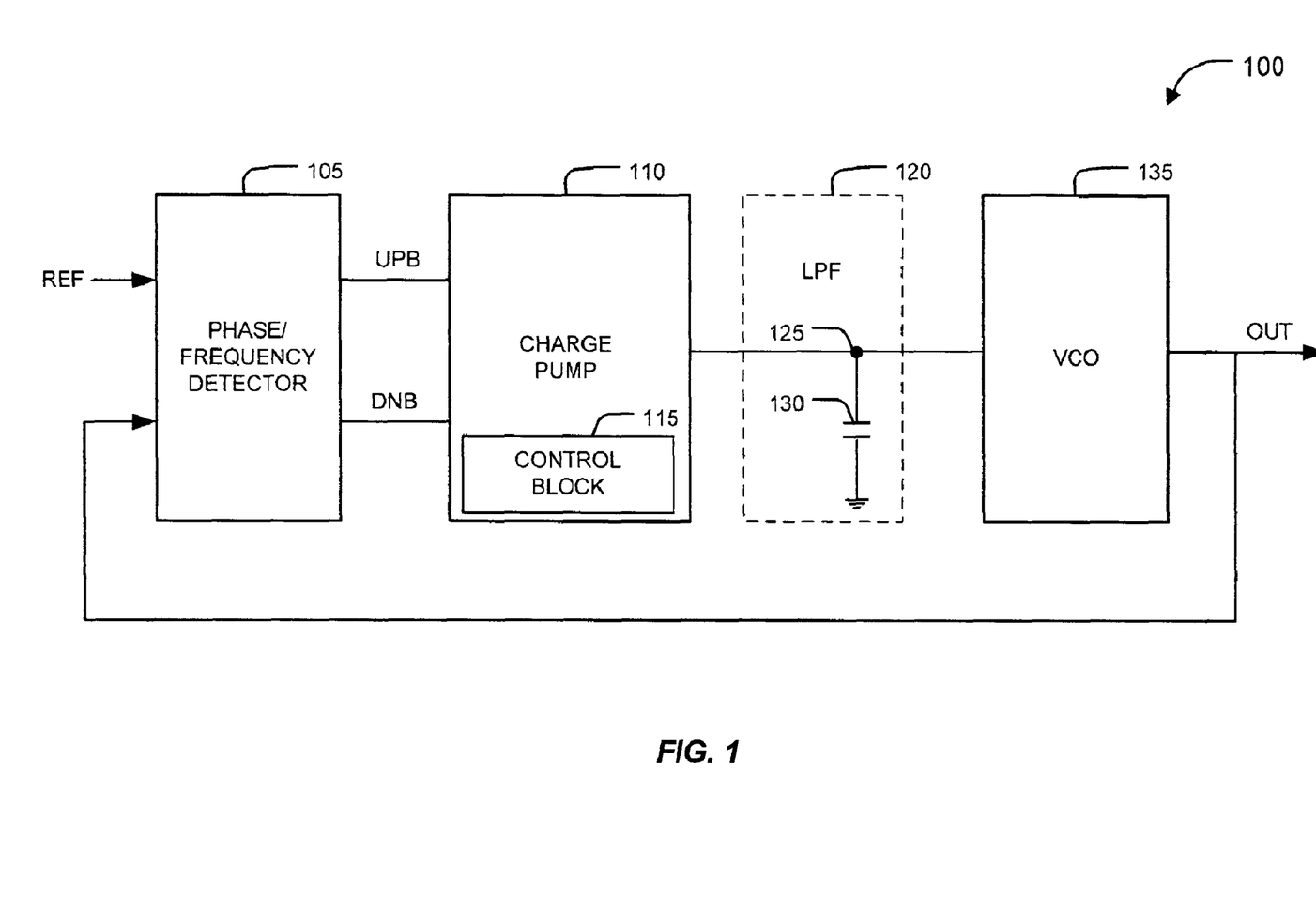
FIG. 1 is a high-level block diagram of a PLL in which the present invention may be embodied.

FIG. 1 is a high-level block diagram of a PLL in which the present invention may be embodied. As shown, phase-locked loop (PLL) 100 has various component parts. PLL 100 includes a phase/frequency detector 105, a charge pump 110, a low-pass filter (LPF) 120, and a voltage controlled oscillator (VCO) 135. Reference signal (REF) is received at a first input terminal of phase/frequency detector 105, and a generated signal (OUT) is supplied at the output of VCO 135. Generated signal OUT is also delivered to a second input terminal of phase/frequency detector 105 thereby providing closed-loop feedback to the system.

Phase/frequency detector 105 receives input signals REF and OUT and, in response, generates signals UPB and DNB that correspond to the phase/frequency difference between the input signals. If signal OUT leads signal REF—indicating that VCO 135 is running relatively slowly—the duration of pulse signal UPB may increase while the duration of pulse signal DNB may decrease. Similarly, if signal OUT lags signal REF—indicating that VCO 135 is running relatively quickly—the duration of pulse signal UPB may decrease while the duration of pulse signal DNB may increase. Phase/frequency detector 105 may continuously activate both UPB and DNB when the PLL has achieved a lock. OUT is considered to be locked to signal REF if its frequency is within a predetermined frequency range of signal REF. Signal OUT is considered to be out-of-lock with signal REF if its frequency is outside the predetermined frequency range of signal REF.

Charge pump 110 receives signals UPB and DNB at its input terminals and controls a current flow at output node 125. As shown, charge pump 110 also includes a control block 115. Control block 115 produces signals that are used within charge pump 110 to control the timing and duration of various current flows. In some embodiments, control block 115 is matched to phase/frequency detector 105 such that, as PLL 100 achieves a lock, power consumption by charge pump 110 is reduced. Control block 115 may include various digital logic elements that operate upon signals UPB and DNB respectively as described herein.

Output node 125 is coupled to low-pass filter 120. For simplicity, LPF 120 is shown as a simple capacitor 130 although it will be understood that various filtering configurations are possible and within the scope of the present invention. In some embodiments, charge pump 110 sources current to output node 125 in response to signal UPB and sinks current from output node 125 in response to signal DNB. For example, charge pump 110 may charge capacitor 130 by forming a conduction path from a power supply to output node 125 and may discharge capacitor 130 by forming a conduction path from output node 125 to a ground potential. By controlling current flow at capacitor 130, charge pump raises or lowers the voltage at output node 125.

Voltage controlled oscillator 135 responds to the voltage at output node 125 by increasing or decreasing the phase/frequency of signal OUT. As its input voltage increases, for example, VCO 135 may advance the phase/frequency of signal OUT in relation to signal REF. Similarly, as its input voltage decreases, VCO 135 may retard the phase/frequency of signal OUT. In this way, PLL 100 forms a closed-loop system that causes generated signal OUT to track reference input REF.

Figure 3:
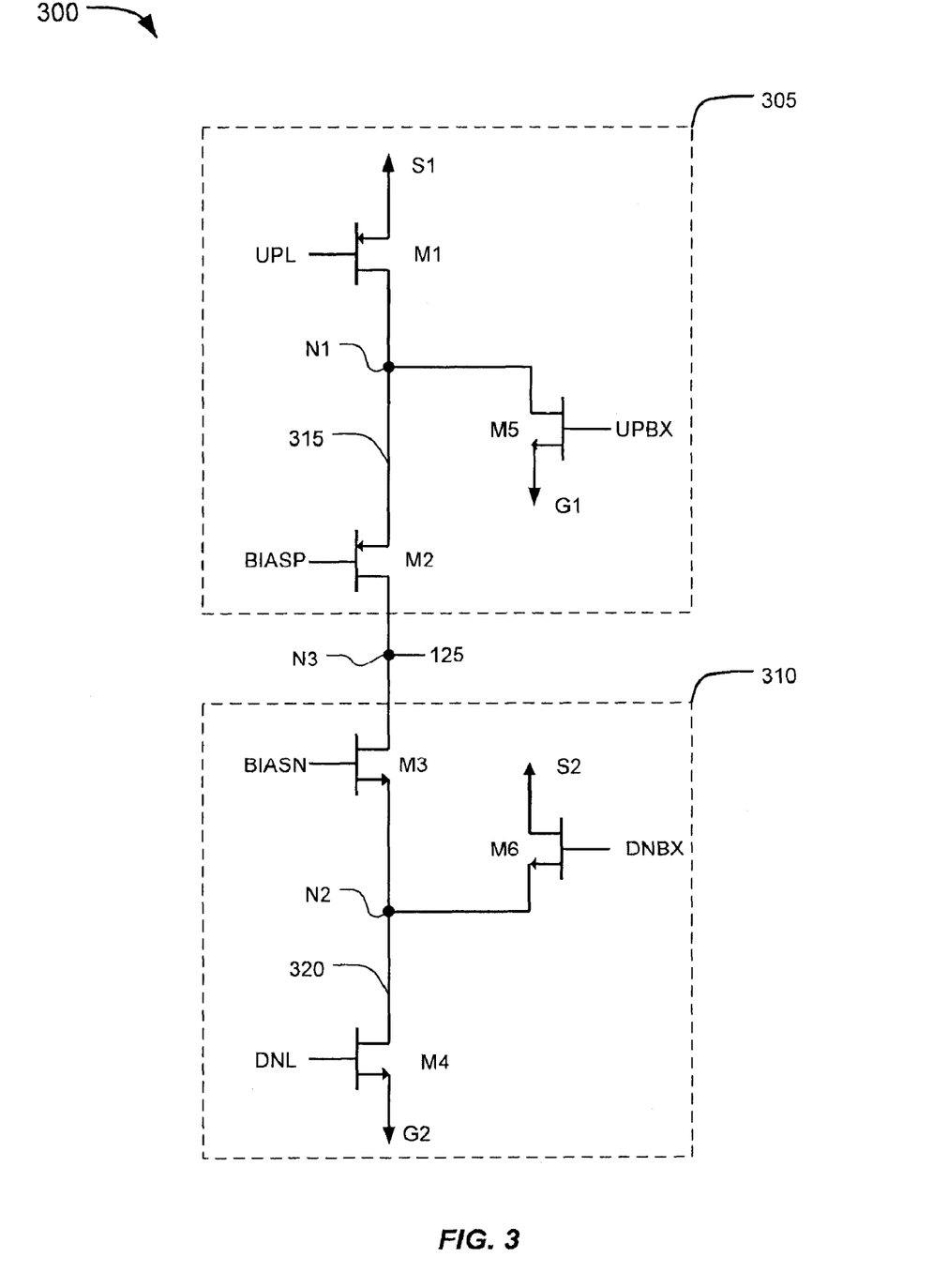
FIG. 3 is a simplified schematic diagram of a charge pump in accordance with embodiments of the present invention.

FIG. 3 is a simplified schematic diagram of a charge pump according to one embodiment of the present invention. As shown, inventive charge pump 300 is configured to receive control signals UPBX and UPL at an upper stage 305 and to receive control signals DNBX and DNL at a lower stage 310. In some embodiments, UPBX, UPL, DNBX, and DNL are digital signals that may include combinations of active-high and active-low logic and that are suitable for controlling other charge pump 300 components. In some embodiments, these control signals may be generated by various logic elements disposed in a control block.

Lower stage 310 includes current source M6, switch M4, and switch M3. Current source M6 is coupled to the power supply at S2 and receives control signal DNBX at its gate terminal. For simplicity, current source M6 and switches M3 and M4 are shown as single transistors. However, it will be recognized that other current source configurations and switching elements are possible and within the scope of the present invention. Switch M4 has its source terminal coupled to ground at G2 and receives signal DNL at its gate terminal. Current source M6, switch M4, and switch M3 are coupled to a lower node N2 which is disposed in a conduction path 320. Switch M3 is also coupled to output node N3.

Figure 4A:
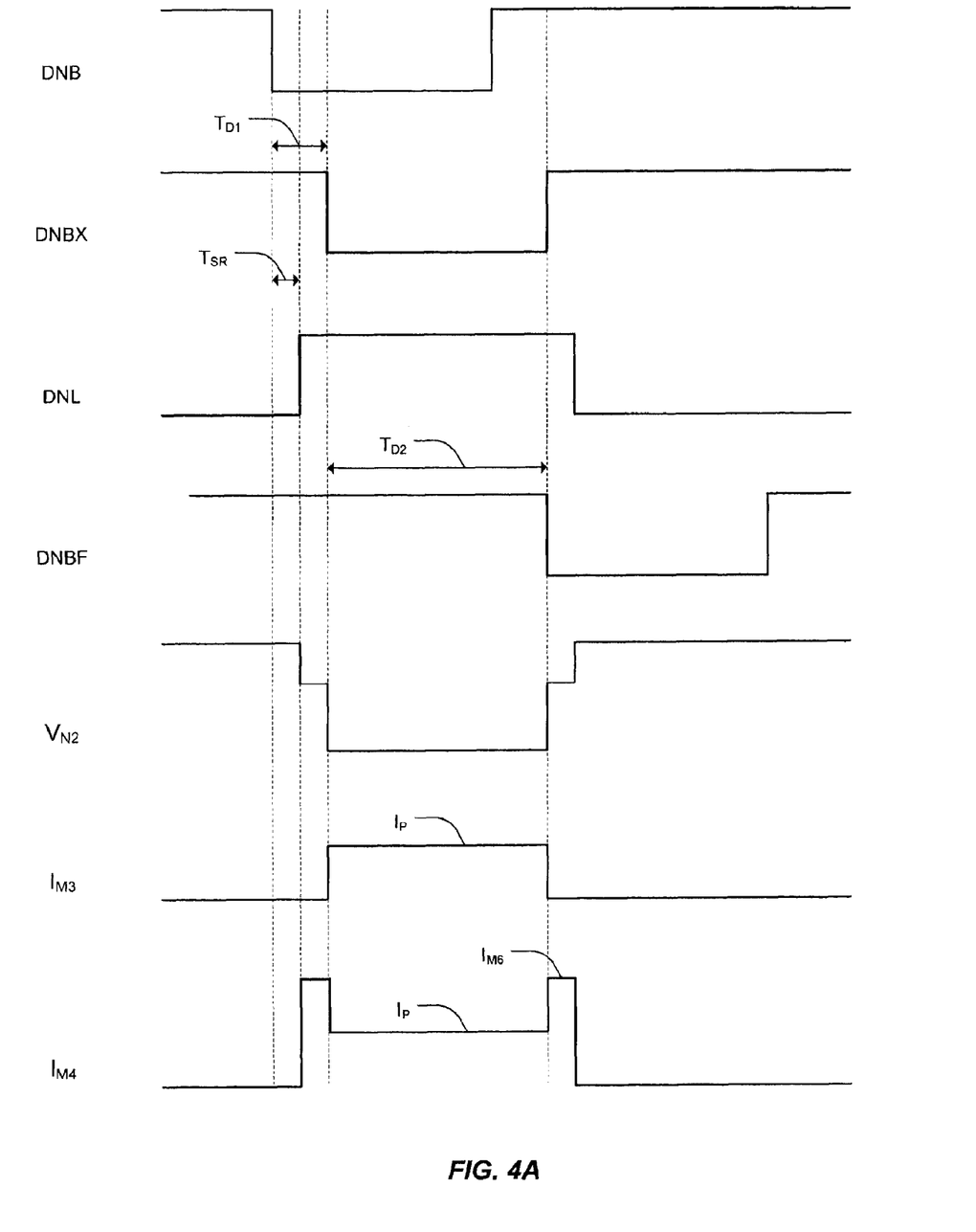
FIG. 4A and FIG. 4B are timing diagrams showing various charge pump signals according to embodiments of the present invention.

The operation of lower stage 310 is now described with reference to FIG. 4A. As shown, signal DNL is high before a rising edge of signal DNBX. Signals DNL and DNBX are then both high for a brief period until a falling edge of signal DNL arrives. During this brief overlap, M6 sources current $I_{M6}$ to M4 which conducts the current to ground. A voltage drop is created across M4 in response to the current flow, thus raising the potential at node N2. When the voltage at node N2 increases, switch M3 reduces the conductivity of path 320. For example, when the voltage at node N2 exceeds a threshold established by bias voltage BIASN, switch M3 turns off and stops conducting. The discharge path from output node N3 to ground G2 is thereby interrupted. When signal DNL goes low, switch M4 turns off. As shown, current $I_{M4}$ drops from the level $I_{M6}$ to approximately zero. Thus, current no longer flows from the power supply to ground and charge pump 300 power consumption is significantly reduced.

An interaction of lower stage 310 control signals at a falling edge of signal DNBX is now described. Signal DNL is high before the falling edge arrives and continues to be high after signal DNBX transitions from high to low. During the brief time that both DNL and DNBX are high, the discharge path from output node N3 to ground G2 is interrupted. Current through switch M3 is approximately zero and a high current $I_{M6}$ flows momentarily in switch M4. However, after signal DNBX goes low, current source M6 is turned off and switch M4 continues to conduct. M4 passively lowers the voltage at node N2. When the voltage at node N2 drops below the threshold established by BIASN, switch M3 begins to conduct current $I_P$. In this way, current $I_P$ flows from output node N3 through switch M3 and switch M4 to ground at G2. In some embodiments, this current flow discharges a capacitor and thereby lowers the voltage at output node N3.

Upper stage 305 functions in a similar manner. Upper current source M5 is coupled to ground at G1 and receives signal UPBX at its gate terminal. Switch M1 is coupled to the power supply at S1 and receives signal UPL at its gate terminal. Current source M5, switch M1, and switch M2 are coupled to an upper node N1 that is disposed in a conduction path 315. Switch M2 is also coupled to output node N3.

Figure 4B:
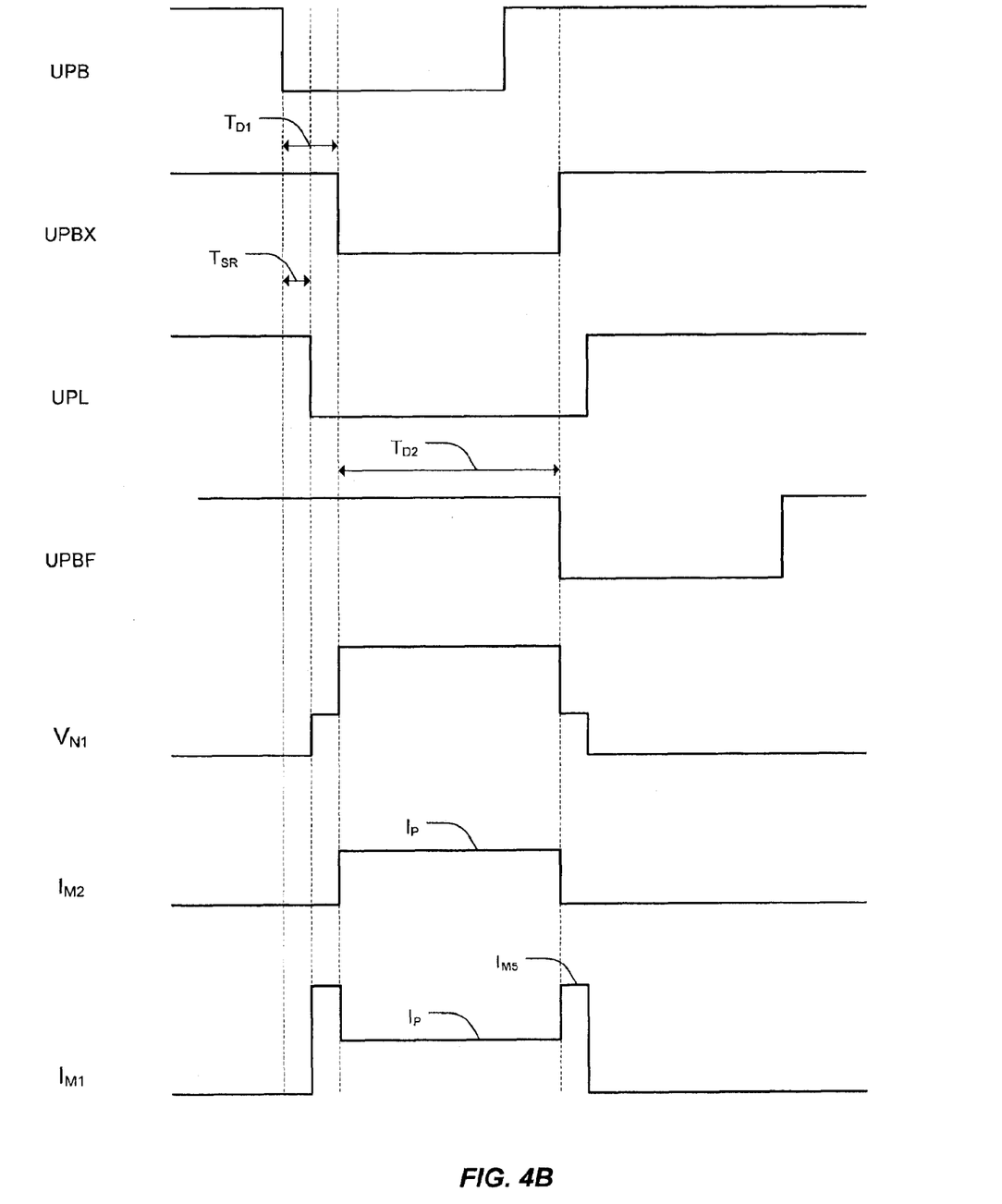

The operation of upper stage 305 is now described with reference to FIG. 4B. Signal UPBX is high shortly before a rising edge of signal UPL. During the brief interval when UPBX is high and UPL is low, M5 turns on and pulls current $I_{M5}$ from the power supply through M1 to ground at G1. This creates a voltage drop across switch M1 and lowers the voltage at node N1. When the voltage at node N1 decreases, switch M2 reduces the conductivity of path 315. For example, when the voltage at node N1 falls below a threshold established by bias voltage BIASP, switch M2 turns off and stops conducting. The charging path from the power supply at S1 to output node N3 is thereby interrupted. Current through switch M2 is approximately zero and a high current $I_{M5}$ flows momentarily in switch M1. When signal UPL goes high, switch M1 turns off. As shown, $I_{M1}$ drops from the level $I_{M5}$ to approximately zero. Thus, current no longer flows from the power supply to ground and charge pump 300 power consumption is significantly reduced.

A different interaction occurs at a falling edge of signal UPL to restore the charging path. Before the falling edge of signal UPL arrives, signals UPL and UPBX are both high. Signal UPL then transitions low. During a brief period when signal UPL is low and signal UPBX is high, M5 pulls current $I_{M5}$ from the power supply through switch M1. However, then signal UPBX transitions from high to low. At this point, M5 switches off and M1 continues conducting. When the voltage at node N1 rises above the threshold established by BIASP, switch M2 turns on and increases the conductivity of path 315. In this way, current $I_P$ flows from the power supply at S1 through switch M1 and switch M2 to the output node N3. In some embodiments, this current flow charges a capacitor and thereby raises the voltage at output node N3.

Power consumption by charge pump 300 is thus reduced by using combinations of input signals DNBX, DNL, UPBX, and UPL. It will be noted that current sources M5 and M6 are active only during a brief period which is determined by the relationship of control signals in upper stage 305 and lower stage 310 respectively. As shown, M6 supplies current to node N2 only when signals DNBX and DNL are both high at the same time. Similarly, M5 draws current through node N1 only when signal UPBX is high and signal UPL is low. As FIG. 4A and FIG. 4B demonstrate, these periods represent only a small fraction of the time that charge pump 300 operates. Thus, according to the present invention, fast response times and charge pump accuracy are maintained while power consumption is reduced.

Figure 5:
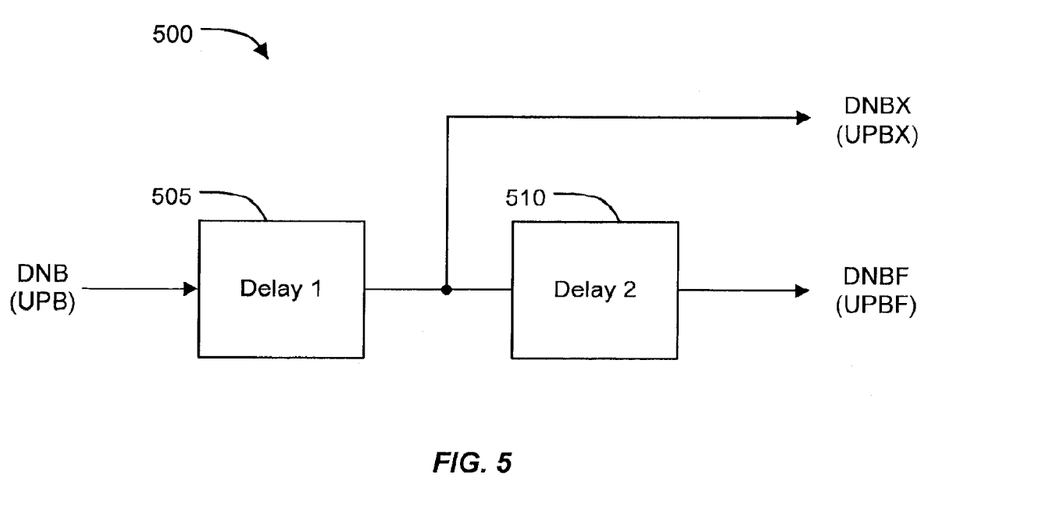
FIG. 5 shows signal generating elements used with a charge pump according to embodiments of the present invention.

FIG. 5 shows various signal generating elements 500 used with charge pump 300 in accordance with embodiments of the present invention. As shown, signal DNB is received at the input terminal of a first delay line element 505. Signal DNB, for example, may correspond to an output signal of phase/frequency detector 105 and may indicate that the PLL's generated signal is leading its reference input.

Signal DNBX is produced at the output of delay line 505 and is a replica of signal DNB that has been delayed by value Delay 1. DNBX is also presented at the input terminal of a second delay line element 510. Second delay line 510 produces signal DNBF at its output as a replica of signal DNBX that has been delayed by value Delay 2. Thus, in this embodiment, signals DNBX and DNBF are both replicas of phase/frequency detector output DNB, each having been delayed for a predetermined amount of time. Additional delay lines are provided for generating signals UPBX and UPBF respectively. These relationships can be appreciated with reference to FIG. 4A and FIG. 4B in which Delay 1 is represented by $T_{D1}$ and Delay 2 is represented by $T_{D2}$.

Figure 6:
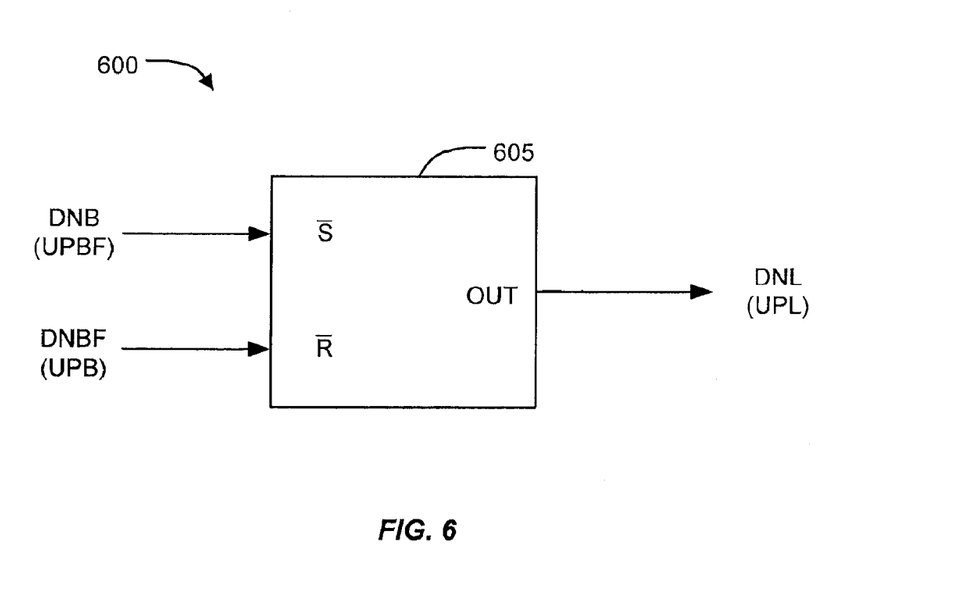
FIG. 6 shows a signal generating element used with a charge pump in accordance with embodiments of the present invention.

FIG. 6 shows an additional signal generating element 600 used with charge pump 300 according to embodiments of the present invention. As shown, set-reset (SR) latch 605 receives signal DNB at its set (S) input and also receives signal DNBF at its reset (R) input. In this embodiment, the S and R inputs are inverted and are triggered when their respective input signals transition from a logic-high to a logic-low state. Thus, in operation, signal DNB first causes signal DNL to rise by triggering SR latch 605 and setting its output value. Thereafter, signal DNBF resets SR latch 605 and causes DNL to transition low. Signal UPL is generated in a similar manner by connecting signal UPBF to the set input and signal UPB to the reset input as shown.

In various embodiments, delay lines 505, 510 and latches 605 are selected to precisely control the timing and duration of bias current flows in the current source and switch pairs. Guidelines for describing the various relationships are provided by the following expressions in which the arrows represent rising or falling signal edges and $T_{SR}$ represents a response time of the SR latch.

$$t_{DNL}\uparrow - t_{DNBX}\downarrow = T_{SR} - \text{delay1} \qquad (1)$$

$$t_{DNL}\downarrow - t_{DNBX}\downarrow = (T_{SR} + \text{delay2}) \qquad (2)$$

$$t_{DNL}\uparrow - t_{DNL}\downarrow = \text{delay1} + \text{delay2} \qquad (3)$$

Figure 7:
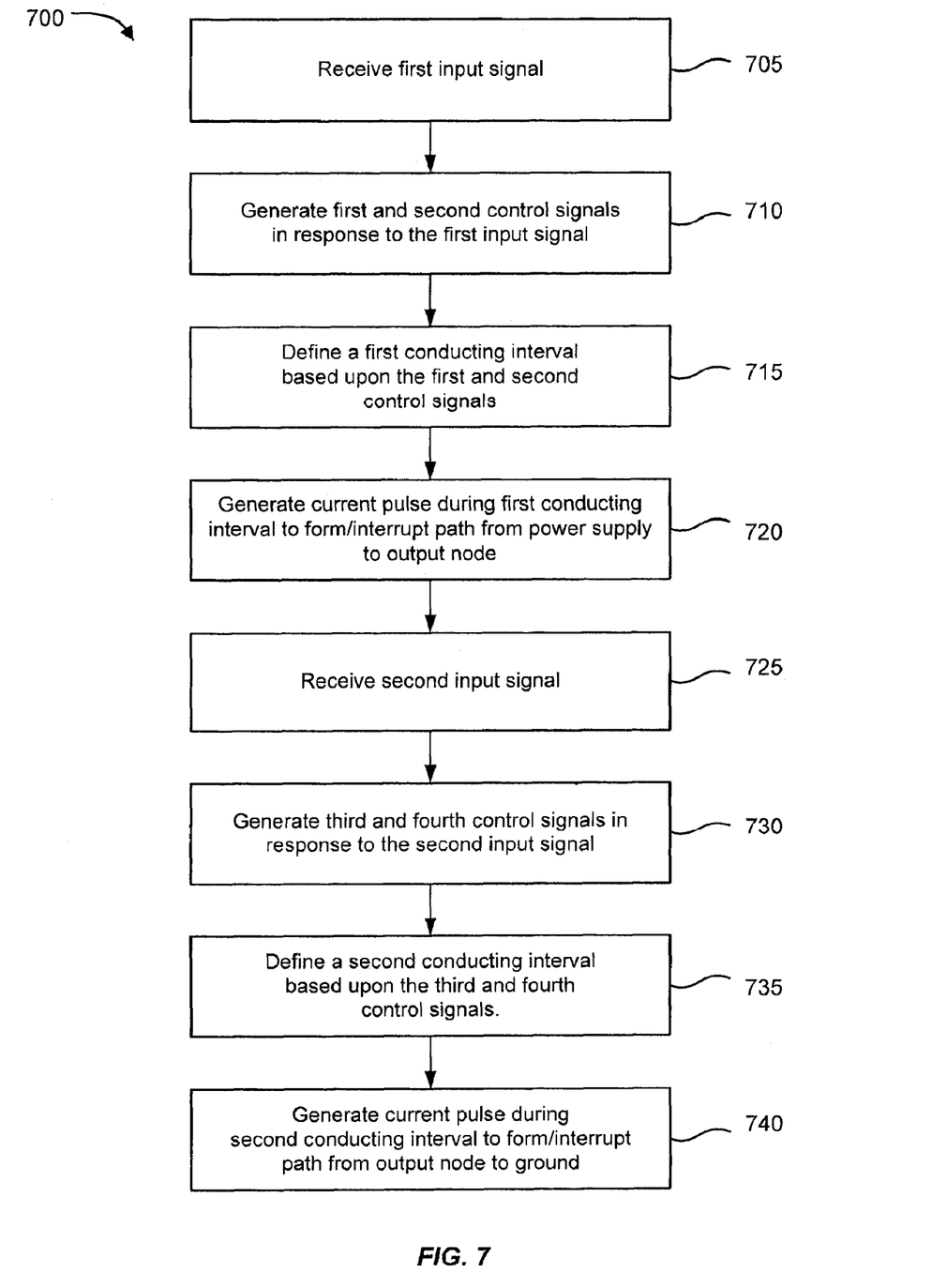
FIG. 7 is a simplified flowchart of a method of controlling a charge pump according to one embodiment of the present invention.

FIG. 7 is a simplified flowchart 700 of a method of controlling a charge pump according to one embodiment of the present invention. At step 705, a first input signal is received indicating that current should be supplied at the output node. For example, the input signal may be supplied by a phase/frequency detector and may indicate that a PLL's generated signal lags its reference signal. Next, at step 710, first and second control signals are generated based upon the first input signal. The control signals determine the timing and duration of current flows within the charge pump. In an exemplary embodiment, the control signals are produced at a signal generating block disposed within the charge pump but they may also be produced externally.

A path is formed between the power supply and the output node based upon a relationship of the two control signals to the first input signal. Thus, in one embodiment, the first and second control signals are generated such that the path is formed as the first input signal transitions from a high level to a low level and the path is interrupted when the first input signal transitions from a low level to a high level. The control signals, for example, may be configured to create a brief conducting interval 715 at each transition of the first input signal. A current is added to the charge pump during the conducting interval. The control signals determine the duration of the conducting interval to create brief current pulses 720 that alternately form or interrupt the path from the power supply to the output node. In some embodiments, the conducting interval lasts only for a brief time defined by the first and second control signals and is configurable to control charge pump power consumption.

A second input signal is received at step 725 and additional control signals are produced. Using the third and fourth control signals, a discharge path between the output node and a ground potential is alternatively formed or interrupted. The third and fourth control signals may be generated 730 such that the path is formed as the second input signal transitions from a high level to a low level and the path is interrupted when the second input signal transitions from a low level to a high level. The control signals, for example, can be configured to create a conducting interval 735 at each transition of the second input signal. A current is added to the charge pump during the conducting interval. The control signals determine the duration of the conducting interval to create brief current pulses 740 that alternately form or interrupt the path from the output node to the ground potential. In some embodiments, the conducting interval lasts only for a brief time defined by the third and fourth control signals and its duration is configurable.

The embodiments described above are illustrative and not limiting. As will be recognized by persons of skill in the art, various alternatives and equivalents are possible within the scope of the present invention. The invention is not limited to the specific type of components, such as PMOS or NMOS transistor elements, logic inverters, current supply circuits, or the like that may be used in the charge pump. The invention is not limited by the type of delay elements or the latches that may be used to generate various signals. The invention is not limited by the type of integrated circuit in which the present invention may be disposed. Nor is the invention limited to any specific type of process technology, e.g., CMOS, Bipolar, or BICMOS that may be used to manufacture the present invention. Other additions, subtractions or modifications that are obvious in view of the present invention are intended to fall within the scope of the appended claims.

What is claimed is:

1. A circuit operative to control current flow at an output node, comprising:
    a first path configured to supply current to the output node, the first path comprising:
    a first switch responsive to a first control signal;
    a first current source coupled to the first switch at a first node and responsive to a second control signal; and
    a second switch coupled between the first node and the output node, wherein a timing of the first control signal and the second control signal are related so as to define a first operating interval in which the first switch conducts a current corresponding to the first current source and a second operating interval in which the first switch conducts a current absent the current corresponding to the first current source;
    a second path configured to receive current from the output node, the second path comprising:
    a third switch responsive to a third control signal;
    a second current source coupled to the third switch at a second node and responsive to a fourth control signal; and
    a fourth switch coupled between the second node and the output node, wherein a timing of the third control signal and the fourth control signal are related so as to define a third operating interval in which the third switch conducts a current corresponding to the second current source and a fourth operating interval in which the third switch conducts a current absent the current corresponding to the second current source;
    a first delay line configured to receive a first input signal and to produce the second control signal by delaying the first input signal for a first predetermined time, wherein a duration of the first operating interval is less than the first predetermined time.

2. The circuit of claim 1 further comprising:
    a second delay line configured to receive the second control signal and to produce a fifth signal by delaying the second control signal by a second predetermined time.

3. The circuit of claim 2 further comprising:
    a third delay line configured to receive a second input signal and to produce the fourth control signal by delaying the second input signal for the first predetermined time; and
    a fourth delay line configured to receive the fourth control signal and to produce a sixth signal by delaying the fourth control signal for the second predetermined time.

4. The circuit of claim 3 further comprising:
    a first latch having a set terminal adapted to receive the fifth signal and a reset terminal adapted to receive the first input signal, the first latch generating the first control signal at its output.

5. The circuit of claim 4 further comprising:
    a second latch having a set terminal adapted to receive the second input signal and a reset terminal adapted to receive the sixth signal, the second latch generating the third control signal at its output.

6. The circuit of claim 5 wherein the first and second predetermined times are configured to limit current flows responsive to said first and second input signals respectively.

7. The circuit of claim 1 further comprising a capacitor coupled to the output node wherein a voltage of the capacitor is increased when current flows in the first path and the voltage of the capacitor is decreased when current flows in the second path.

8. The circuit of claim 5 further comprising:
    a phase/frequency detector configured to generate said first and second input signals.

9. The circuit of claim 5 further comprising:
    a voltage-controlled oscillator coupled with the output node and operative to generate an output signal that varies according to a voltage of said output node.

10. The circuit of claim 1 wherein the second switch comprises a p-channel transistor having a gate coupled with a first biasing voltage.

11. The circuit of claim 1 wherein the fourth switch comprises an n-channel transistor having a gate coupled with a second biasing voltage.

12. The circuit of claim 1 wherein the first and second current sources comprise n-channel transistors and the second and third control signals have a same polarity.

13. The circuit of claim 1, wherein the first operating interval has a duration that is shorter than the second operating interval and the third operating interval has a duration that is shorter than the fourth operating interval.

* * * * *